United States Patent [19]
Eastlund

[11] Patent Number: 5,630,880
[45] Date of Patent: May 20, 1997

[54] METHOD AND APPARATUS FOR A LARGE VOLUME PLASMA PROCESSOR THAT CAN UTILIZE ANY FEEDSTOCK MATERIAL

[76] Inventor: Bernard J. Eastlund, 6615 Chancellor Dr., Spring, Tex. 77379

[21] Appl. No.: 612,252

[22] Filed: Mar. 7, 1996

[51] Int. Cl.$^6$ .................................................. C23C 16/00
[52] U.S. Cl. ........................ 118/723 MP; 118/723 I; 118/723 IR; 118/719; 118/724
[58] Field of Search .................... 118/723 MP, 723 IR, 118/723 I, 723 MR, 723 MA, 723 AN, 723 DC, 723 CB, 719, 724, 728; 156/345

[56] References Cited

U.S. PATENT DOCUMENTS

| | | | |
|---|---|---|---|
| 3,886,896 | 6/1975 | Van Ckenberghe | 118/49.1 |
| 4,853,250 | 8/1989 | Boulos et al. | 427/34 |
| 4,878,989 | 11/1989 | Purdes | 156/613 |
| 5,284,544 | 2/1994 | Mizutani et al. | 156/345 |
| 5,356,672 | 10/1994 | Schmitt, III et al. | 427/446 |
| 5,356,673 | 10/1994 | Schmitt et al. | 427/446 |
| 5,421,891 | 6/1995 | Campbell et al. | 118/723 R |
| 5,472,507 | 12/1995 | Yamaguchi et al. | 118/723 |

OTHER PUBLICATIONS

1994 Lieberman & Herman, "Principles of Plasma Discharge Processing," Wiley–Interscience, New York, N.Y.

1988 Herman, "Plasma Spray Coatings," Scientific American p. 112, Sep.

1988 Huggins, Bube & Vermilyea, "A Quarter Century of Plasma Spraying," Annual Review of Mat. Science, Palo Alto, CA. V.13.

1994 Musa, Enrich & Mausbach, "Sutides on Thermionic Cathode Anodic Arcs," J. Vac. Sci. Technol. A 12(5) Sep./Oct.

1969 Eastlund & Gough, "The Fusion Torch–Closing the Cycle From Use to ReUse," WASH–1132, US AEC, May 15.

1991 Eastlund and Gough, "Near Term Recycling Option Using Fusion Grade Plasmas," Fusion Technology, Vo.20, p. 987.

1982 Dolan, "Fusion Research," Pergamon Press, New York, N.Y.

1971 Gough & Eastlund, "The Prospects of Fusion Power," Scientific American, Feb.

1995 Furth, "Fusion", Scientific American, Sep.

1984 Post et al, "Physics of Plasma Wall Interactions in Controlled Fusion," NATO ASI Series Series B:Physics, vol. 131, Plenum Press, NY.

1994 Strachan et al, "Wall Conditioning Experiments Using Impurity Pellet Injection," J. of Nuclear Materials, 217, 145–153.

1976 Various, "Texas Experimental Tokamak", University of Texas, Austin, Texas Jun.

1993 McNeil, "Pyrolysis in Tokamak Plasmas," Industrial Applications of Plasma Physics, ISPP–13, SIF, Bologna, Italy.

1993 Combs, "Pellet Injection Technology," Rev. Sci. Instruments, vol. 41, No. 7, Jul.

1991 McCool, "An Assessment of the Feasibility of Fueling a Tokamak Reactor With LT Pellets," Un. of TX, Res. Report FRCR 389, May 26.

(List continued on next page.)

*Primary Examiner*—R. Bruce Breneman
*Assistant Examiner*—Joni Y. Chang

[57] ABSTRACT

This invention utilizes a large volume plasma processor to completely ionize any feedstock material and deposit the ionized and unionized species of elements of the feedstock material on deposition stages. Apparatus is provided for generating a toroidal, high temperature, low density plasma in the large volume plasma processor. Key aspects of the method provide for (a) controlling temperature by rapid heating and (b) maintaining toroidal plasma current by rapid application of increased driving voltages. The invention provides a large surface area source of any desired elements to increase safety and thruput in microchip fabrication. Other applications include nanotechnology fabrication and improvement of surface properties of materials.

20 Claims, 16 Drawing Sheets

OTHER PUBLICATIONS

1993 Van Houtte, "One Minute Pulse Operation in the Tore Supra," Nuclear Fusion, vol. 33, No. 1.

1965 Berger & Seltzer, "Tables of Energy Losses and Ranges of Electrons and Protons," Nuc. Science, Series 39, Wash. D.C.

1993 Finken, et al., "Plasma Performance in TEXTOR After Pellet Injection", Fus. Tech. & Plasmas, North–Holland, NY 1–131–133.

1995 Pool, "Atom Smith", Discover, Dec.

1994 Bunstrah, "History and Current Status of Vacuum Technology," J. Vac. Sci. Technology,, A 12(4), Jul./Aug.

1993 Finken et al, "Plasma Performance of TEXTOR After Pellet Inj." Fusion Technology and Plasmas, North–Holland, NY I–131–132.

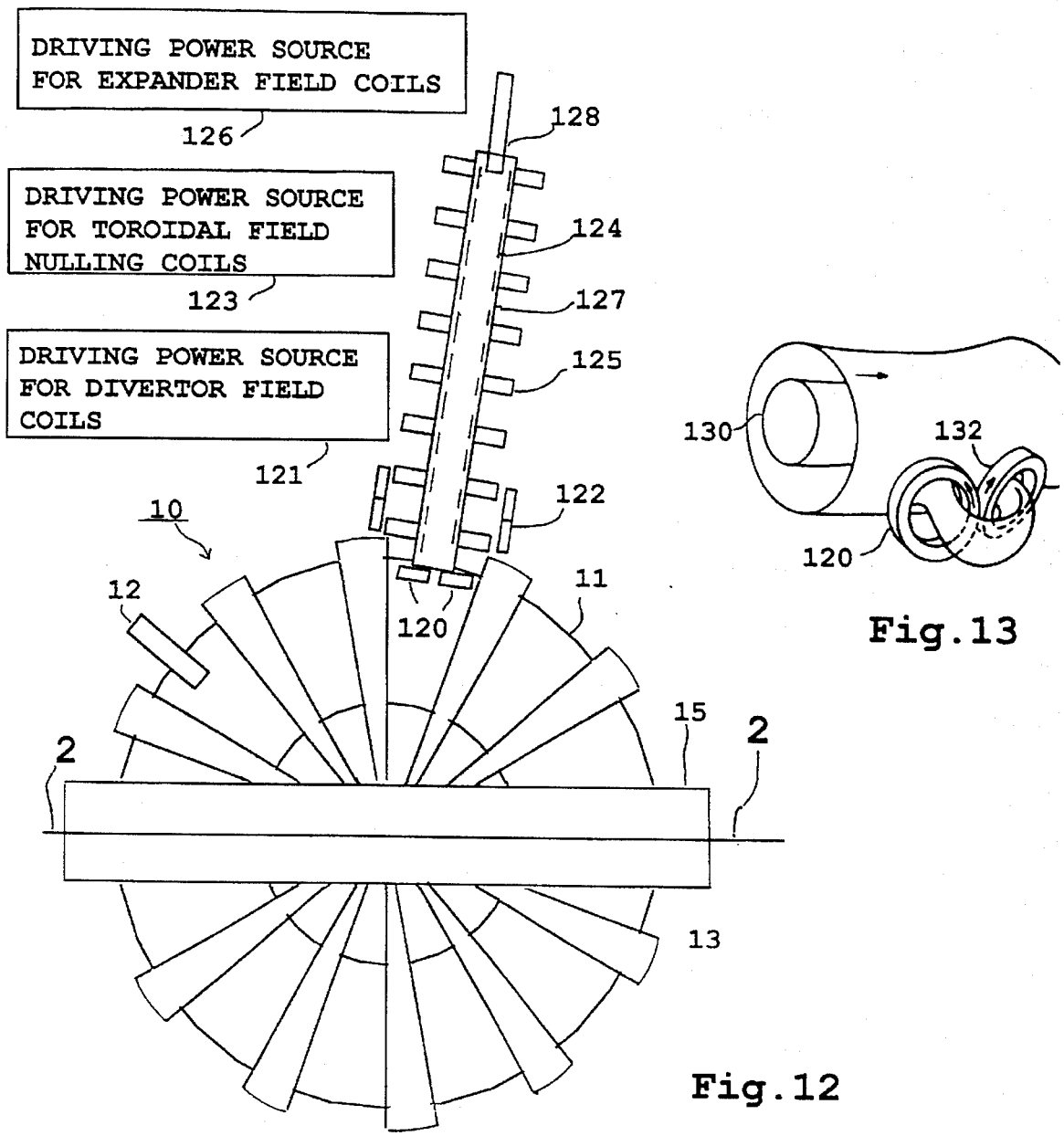

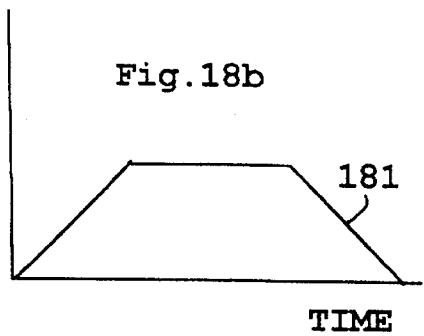
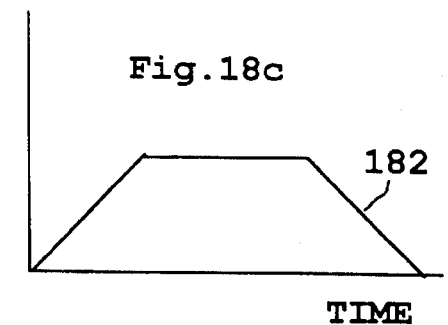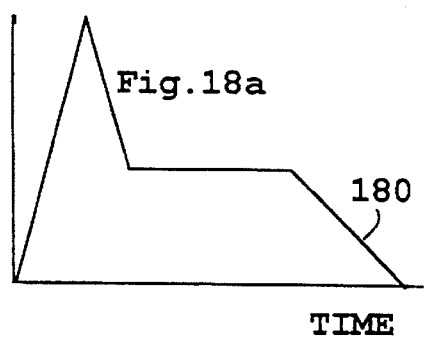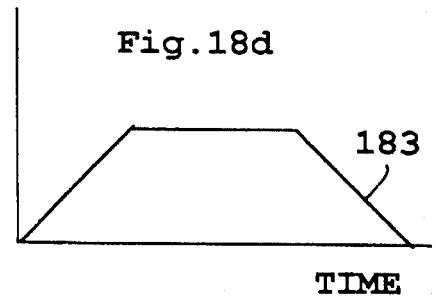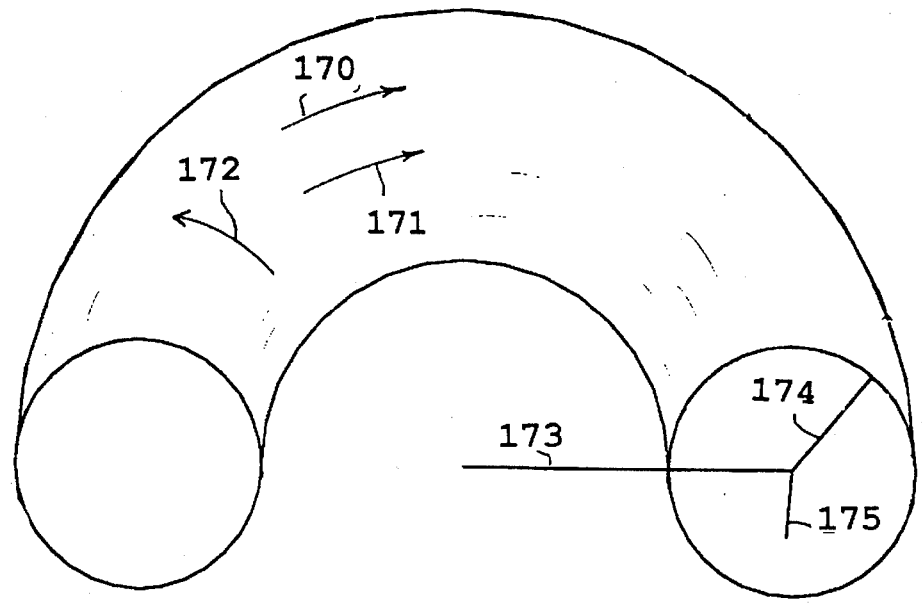
Fig. 17

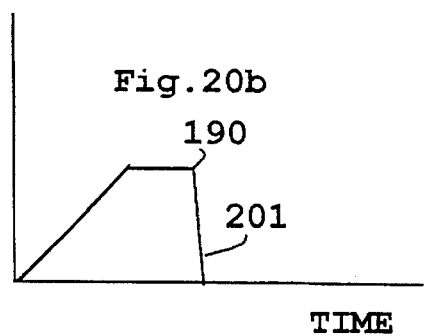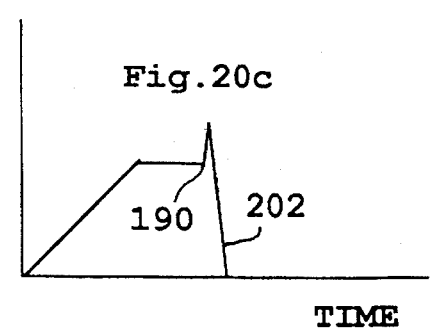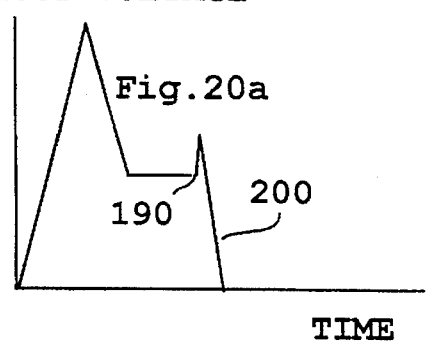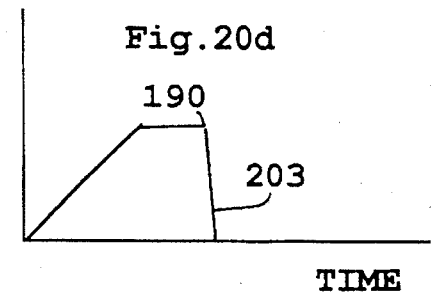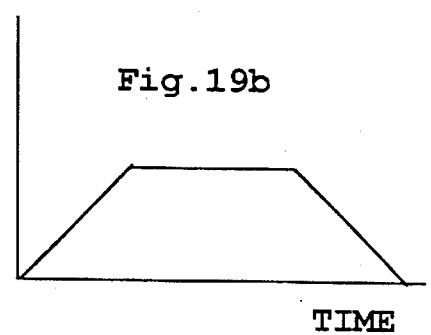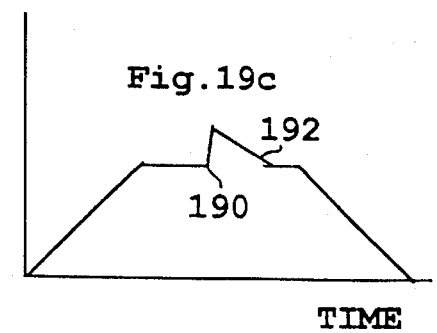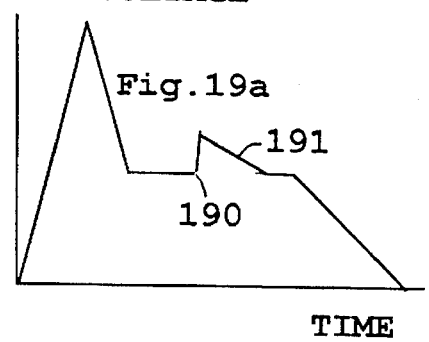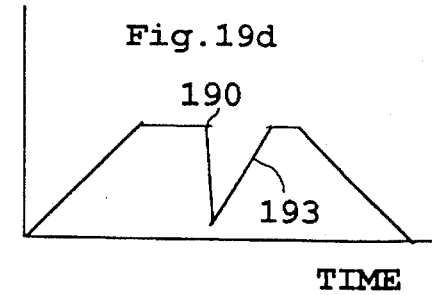

METHOD AND APPARATUS FOR A LARGE VOLUME PLASMA PROCESSOR THAT CAN UTILIZE ANY FEEDSTOCK MATERIAL

DESCRIPTION

1. Technical Field

This invention relates to a plasma processor. Preferably it is a semiconductor fabrication apparatus, a surface modification and/or coating apparatus, and/or a materials beneficiation or recycling apparatus, which generates a large volume product plasma by injection of any feedstock into a high temperature, low density ionized gas plasma spaced from the walls of the toroidal containment vessel by magnetic fields.

2. Background Art

Plasma processors for semiconductor fabrication enable a wider range of ions, elements and molecules to be used for thin film processing than are available through strictly chemical methods. For a more detailed description of plasma processor technologies see "Principles of Plasma Discharges and Materials Processing," Lieberman and Lichtenberg, Wiley-Interscience Company, New York, N.Y., 1994.

These typically low density devices (<1 torr) have electron temperatures between 10,000 and 70,000 degrees Celcius, but are limited to the use of feedstock species than can exist in a gas phase.

Plasma torches operate at 5,000 to 15,000 degrees Celsius and pressures of 100 torr to 3000 torr or more. For a more detailed understanding of the technology of commercial plasma torches see "Plasma Spray Coatings", Herman, Scientific American, Sept. 1988 and "A Quarter of a Century of Plasma Spraying", Zaat, in "Annual Review of Materials Science," Huggins, Bube and Vermilyea, Annual Reviews Inc., Palo Alto, Calif., Vol. 13, 1988.

These torches are in wide spread use for coating of surfaces with materials that can be processed in the torch. i.e. coating of aircraft engine turbine blades with ceramics. Such torches can coat surfaces with atoms, molecules and melted particulates of various materials, but cannot vaporize most solid particulates.

Vacuum arcs and electron beams are used to produce discharges or vapors of copper, tungsten, etc, and other elements difficult to deposit or sputter on surfaces. For example, see "Studies on Thermionic Cathode Anodic Vacuum Arcs", Musa et al, J. Vac. Sci. Technol. A 12(5), Sept/Oct 1994. These sources are also limited by their size and their tendency to produce metal macroparticles, rather than metallic vapor.

A theoretical concept described as "The Fusion Torch" has been proposed by the inventor to use the high energy flux plasmas typical of controlled fusion research devices as a "universal solvent" to vaporize, dissociate and ionize any substance. See for example, "The Fusion Torch-Closing the Cycle from Use to ReUse", B. J. Eastlund and W. C. Gough, WASH-1132, U.S.A.E.C. May 15, 1969, and "Near Term Recycling Options Using Fushion-Grade Plasmas", Eastlund and Gough, Fusion Technology, December, 1991. These papers, and other papers on the "Fusion Torch" cited in these references, were in general terms, did not address high atomic number radiation loss containment problems and did not specify how to build such devices for process applications.

For a brief description of controlled fusion reasearch devices, see "Fusion Research", Dolan, Pergamon Press, New York, N.Y., 1982. This, and other similar articles and books on fusion research are written with emphasis on the physics necessary to achieve electricity producing controlled fusion devices and do not emphasize specific descriptions of how to build such devices for process applications.

The most successful class of controlled fusion research devices are known as Tokamaks. Tokamaks have been built that can routinely produce high energy flux plasmas of 100,000,000 degrees Celsius. See, "The Prospects of Fusion Power", W. C. Gough and B. J. Eastlund, Scientific American, Feb. 1971 and "Fusion", Furth, Scientific American, Sept. 1995. Plasma processing techniques using gas phase feedstock have been used to clean the vacuum chamber walls and to deposit coatings of low atomic number (Z) materials such as boron, carbon, lithium and silicon on all parts exposed to the high energy flux plasmas produced in such devices. For example, see "Physics of Plasma-Wall Interactions in Controlled Fusion", Post et al, NATO ASI Series, Series B: Physics Vol. 131, Plenum Press, NY, 1984.

Solid materials injected into the high energy flux research plasmas have been used as feedstock for similarly coating the walls. Wall coatings have been successfully achieved with pellets of lithium, lithium deuteride, boron and carbon. The carbon pellets have been difficult to use because they can occasionally cause the high energy flux research plasmas to become unstable and extinguish. See for example, "Wall Conditioning Experiments on TFTR Using Impurity Pellet Injection", Strachan et al, Journal of Nuclear Materials 217, 145–153, 1994. Pellets of tungsten, molybdenum and other high Z materials immediately extinguish the plasmas in Tokamak devices as presently built and operated. For descriptions of how to build a Tokamak device, see "The Texas Experimental Tokamak, A Fusion Plasma Research Facility", Proposal to The Energy Research and Development Administration, by The Fusion Research Center of the University of Texas at Austin, June, 1976.

A paper has appeared in which a Tokamak device was suggested as a means of pyrolysis of toxic wastes, but, like "The Fusion Torch", this work did not address key issues of how to construct a device that could handle disruptions caused by toxic materials with high Z content. See "Pyrolysis in Tokamak Plasmas", McNeil, Industrial Applications of Plasma Physics, ISPP-13, edited by Bonizzoni, Hooke and Sindoni, SIF, Bologna, 1993.

Thus, virtually all plasma devices, as presently operated and conceived, have limitations on the feedstock material from which they are formed, thus limiting their application flexibility.

SUMMARY OF INVENTION

This invention has been made in order to solve the problem of feedstock flexibility described above, and has as its principal object to provide a novel method of coating deposition stages with the ionized and nonionized species of elements of any feedstock material.

The method in accordance with this invention utilizes a large volume plasma processor and consists of basically eight steps. The first step is to fill a toroidal containment vessel with a low density gas such as hydrogen, helium or neon. The second step, is to increase the temperature of the low density gas until it has become a fully ionized gas, with a temperature of more than 500,000° C. This plasma is referred to hereafter as the "process plasma".

The third step is to confine the "process plasma" with magnetic fields so that it is spaced from the walls of the containment vessel. The fourth step is to inject a portion of any feedstock material into this "process plasma" so that the high temperature gas of the "process plasma" can form a combination with the ablating feedstock material to form a "combination plasma". The fifth step is to rapdily increase the power applied to the combination plasma in order to balance radiation losses so that all of the feedstock material can be transformed into a lower temperature, higher density ionized gas plasma composed principally of said ionized species of elements of the feedstock material. This plasma is referred to hereafter as the "product plasma". The sixth step is to provide stabilization means of maintaining the position of the "product plasma" spaced from containment vessel walls by at least one method such as rapidly increasing the voltage driving the toroidal electric current in the product plasma.

The seventh step is to move a portion of the "product plasma" across the space between the edge of the "product plasma" and the containment vessel walls to deposit on deposition stages lining the walls of the containment vessel by adjusting the confinement conditions by at least one method such as changing the position of limiters that define the edge of the plasma. The eighth step is to remove the deposition stages.

Another object of this invention is a method of making the "process plasma" in a manner such that the low density, high temperature ionized gas of the "process plasma" has a thermal and a nonthermal component and is more efficient at transforming a portion of the feedstock material into a "product plasma" than by a thermal component alone.

Another object of this invention is a method of repetitively performing the eight steps of the method which is the principal object described above.

Another object of this invention is a method of diverting the "product plasma" into at least one other containment vessel which is also lined with deposition stages.

Another object of this invention is to provide a novel large volume plasma processor apparatus for coating deposition stages with the ionized and nonionized species of elements of any feedstock material.

Another object of this invention is to provide an apparatus for rapidly heating the "combination plasma" to balance radiation losses.

Another object of this invention is to provide an apparatus which is a stabilization means for maintaining the position of the "product plasma" spaced from the walls of the containment vessel.

Another object of this invention is to provide an apparatus which is a means of adjusting the space between the forms of plasma described above and the walls of the containment vessel.

Another object of this invention is providing a means of shielding the deposition stages from the "process plasma" during the heating stage of repetitively pulsed operation.

Another object of this invention is to provide and apparatus for diverting the "product plasma" into at least one other containment vessel which is also lined with deposition stages.

This invention will make possible major new useful applications. The invention can be used to improve safety, broaden materials selection options, and increase thruput in microchip fabrication. The invention can also be used for nanotechnology fabrication, for improving the surface properties of materials, for materials beneficiation and for recycling applications.

Other objects, features and advantages of the invention will be apparent from the drawings, from the specifications and embodiments, and the claims.

BRIEF DESCRIPTION OF THE DRAWINGS

The actual construction, operation and apparant advantages of this invention will be better understood by referring to the drawings in which like numerals identify like parts and in which:

in FIG. 10.

FIG. 12 is a top view and cross section, partly in blocks, showing the addition of magnetic field coils for diverting the plasma from the toroidal containment vessel into an additional containment vessel.

FIG. 13 is a schematic depicting the magnetic fields puckered out by the diverting magnetic field coils of FIG. 12.

FIG. 17 is a schematic depicting the electric current and magnetic field structure in the toroidal containment vessel.

FIG. 18a is a waveform diagram showing the time dependence of the loop voltage which causes ohmic heating current to flow in the toroidal direction in the toroidal containment vessel.

FIG. 18b is a waveform diagram showing the time dependence of the electric current.

FIG. 18c is a waveform diagram showing the time dependence of electron number density.

FIG. 18d is a waveform showing the time dependence of the electron temperature.

FIG. 19a is a waveform diagram showing the time dependence of loop voltage during low atomic number pellet injection.

FIG. 19b is a waveform diagram showing the time dependence of electric current during low atomic number pellet injection.

FIG. 19c is a waveform diagram showing the time dependence of electron number density during low atomic number pellet injection.

FIG. 19d is a waveform diagram showing the time dependence of electron temperature during low atomic number pellet injection.

FIG. 20a is a waveform diagram showing the time dependence of loop voltage during high atomic number pellet injection.

FIG. 20b is a waveform diagram showing the time dependence of electric current during high atomic number pellet injection.

FIG. 20c is a waveform diagram showing the time dependence of electron number density during high atomic number pellet injection.

FIG. 20d is a waveform diagram showing the time dependence of electron temperature during high atomic number pellet injection.

PREFERRED EMBODIMENTS OF THE INVENTION

Now, embodiments of this invention will be described in detail with reference to the accompanying drawings.

Figure 2:
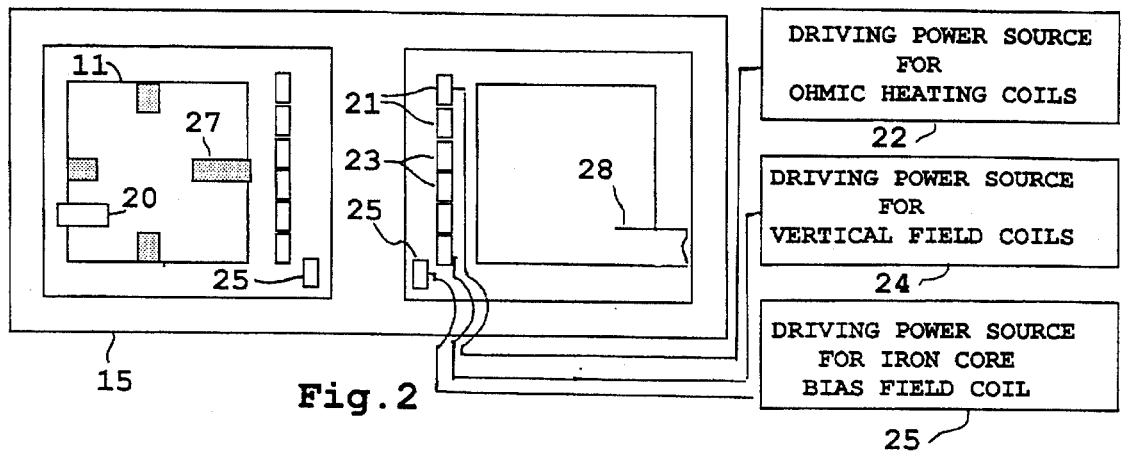
FIG. 2 is a cross section, partly in blocks, through the line 2 in FIG. 1, that shows internal construction details of the large volume plasma processor.
Figure 1:
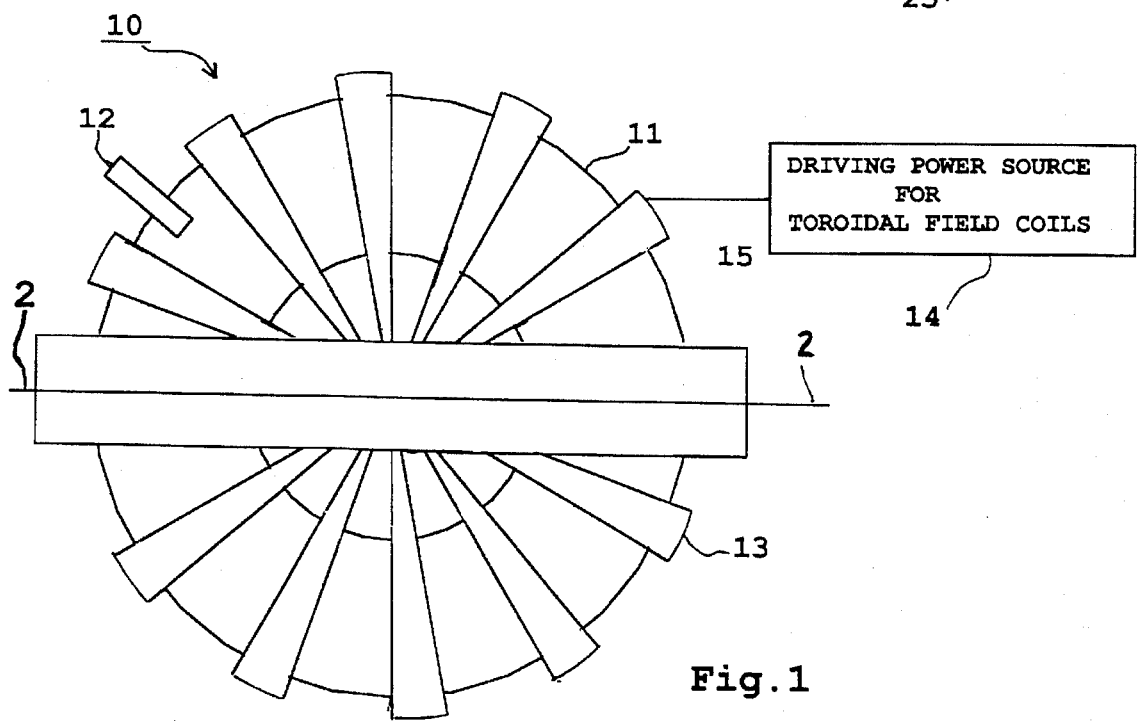
FIG. 1 is a top view, partly in blocks, showing the construction details of a large volume plasma processor.

FIG. 1 and FIG. 2 describe the system components required to build a large volume plasma processor that can produce a "process plasma" as described in the disclosure section above.

FIG. 1 is a top view, partly in blocks, that shows construction details of a large volume plasma processor comprising a process plasma generation portion 10 with a toroidal containment vessel 11, a gas inlet 12 for supplying a generating gas, such as hydrogen, helium or neon, for the generation of the process plasma, toroidal magnetic field generation coils 13, a driving power source 14 for the toroidal field generation coils, an iron core yoke 15 to link the current in the ohmic heating coils with the toroidal current in the toroidal containment vessel.

FIG. 2 is a cross section, partly in blocks, through the line 2 in FIG. 1, that shows internal construction details of the large volume plasma processor, with a plasma ignitor 20, ohmic heating coils 21 for heating the process plasma, a driving power source 22 for the ohmic heating coils, vertical field coils 23 for positioning the process plasma within the toroidal containment vessel 11, a driving power source 24 for the vertical field coils, iron core bias field coils 25, a driving power source 26 for the iron core bias field coils, limiters 27 to define the shape of the high energy flux plasma, and an exhaust pipe 28.

Figure 4:
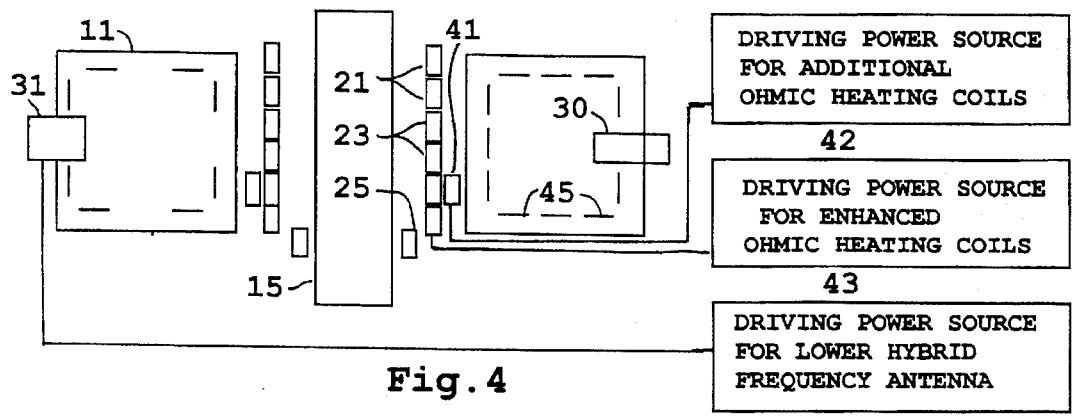
FIG. 4 is a cross section, partly in blocks, through the line 3 in FIG. 3, that shows additional construction details of the large volume plasma processor.
Figure 3:
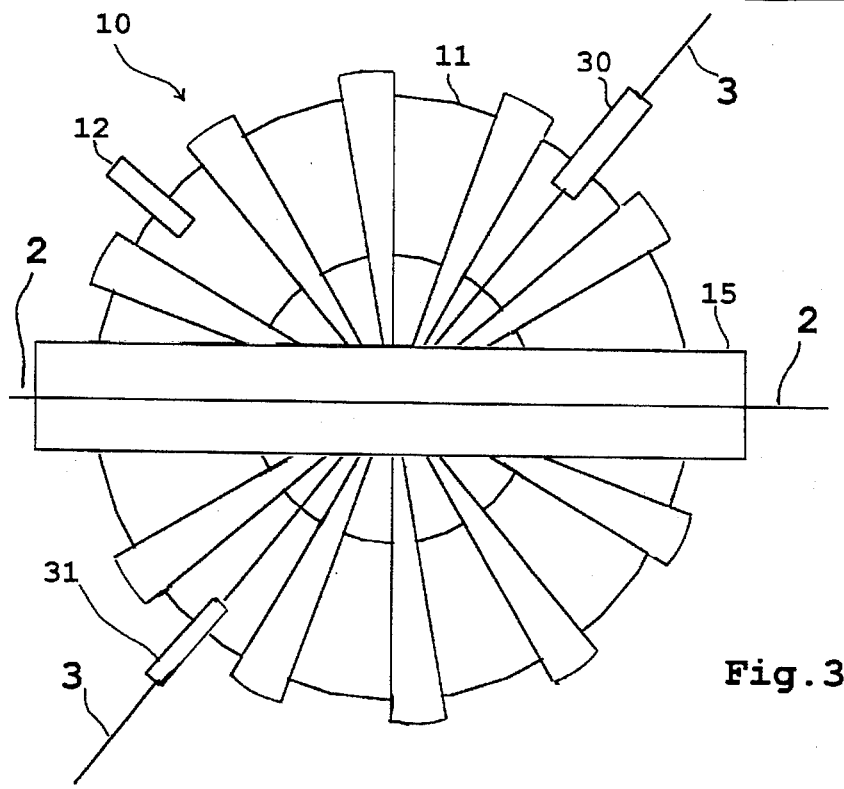
FIG. 3 is a top view, partly in blocks, that shows an injector portion and an antenna attached to the large volume plasma processor.

FIG. 3 and FIG. 4 describe the system components that are used to inject feedstock material and to heat and stabilize the interacting mixture of process plasma and feedstock material, referred to as the "combination plasma" in the disclosure above.

FIG. 3 is a top view, partly in blocks, that shows an injector portion 30 and an antenna 31 attached to the toroidal containment vessel 11.

FIG. 4 is a cross section, partly in blocks, through the line 3 in FIG. 3, that shows internal details that include additional ohmic heating coils 41, driving power source 42 for the additional ohmic heating coils, enhanced driving power source 43 for the ohmic heating coils 15, an antenna 31 and a driving power source 44 which is a lower hybrid frequency generator for the antenna 31 and deposition stages 45.

By way of example, a set of typical parameters for component sizes and power supplies suitable for a pulsed mode of operation are described in detail.

The typical dimensions for the toroidal containment vessel 11 of FIG. 1 are a major radius, $R_M$, of 100 cm and a minor radius, $r_m$, of about 50 cm. A typical material for the containment vessel 11 is stainless steel with a ceramic gap to allow transient magnetic fields to enter the containment vessel. The cross section of the toroidal containment vessel can be square as shown in FIG. 2, in which case $r_m$ is a mean of the dimensions. The cross section can be circular, octaganal or any continuous shape.

The toroidal magnetic field generation coils 13 as shown in FIG. 1 are made with 6 turns of copper wire that have a resistance of 1.2 milliohms and an inductance of 2 millihenry's. The outer dimensions of each coil are 150 cm×150 cm×90 cm. The bore is a rectangle with dimensions of 80 cm×90 cm.

Figure 5:
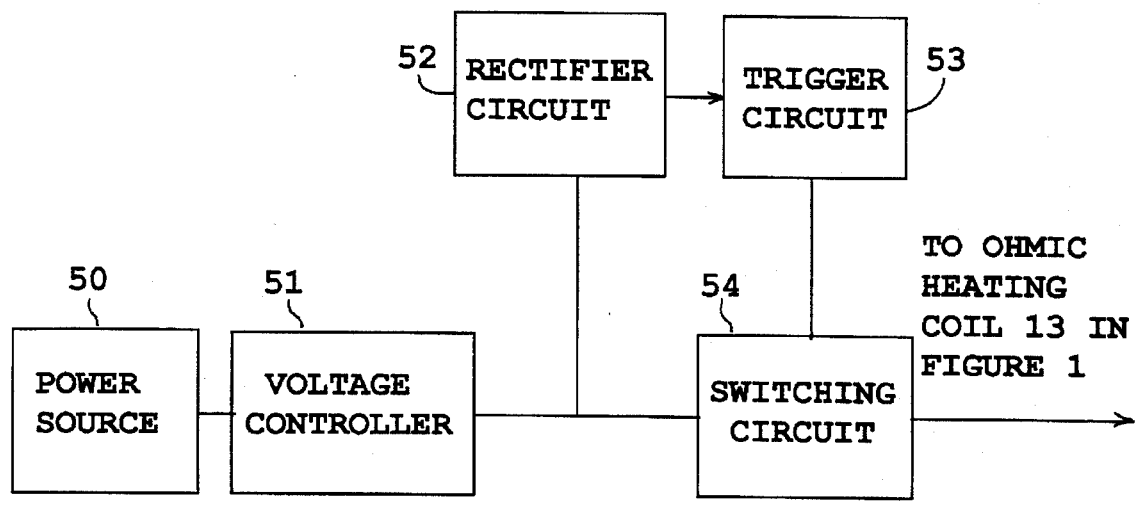
FIG. 5 is a detailed block diagram of a driving power source for the toroidal field coils shown in FIG. 1.

A detailed block diagram of the driving power source 14 for the toroidal field coils is shown in FIG. 5. By way of example, this driving power source for the toroidal field coils is constructed with a power source 50 of 500 volts with single phase current capability of 157 kiloamperes, with a total power capability of 65 Megawatts, a voltage controller 52 which controls the output power of the power source 50, a rectifier circuit 52, which rectifies the controlled output current, a trigger circuit 53, which generates firing signals, and a switching circuit 54 to turn the system on and off.

The ohmic heating coils 21 of FIG. 2 are made with copper coils of from 90 to 180 cm in diameter with conducting cross sections of about 2×5 cm.

Figure 6:
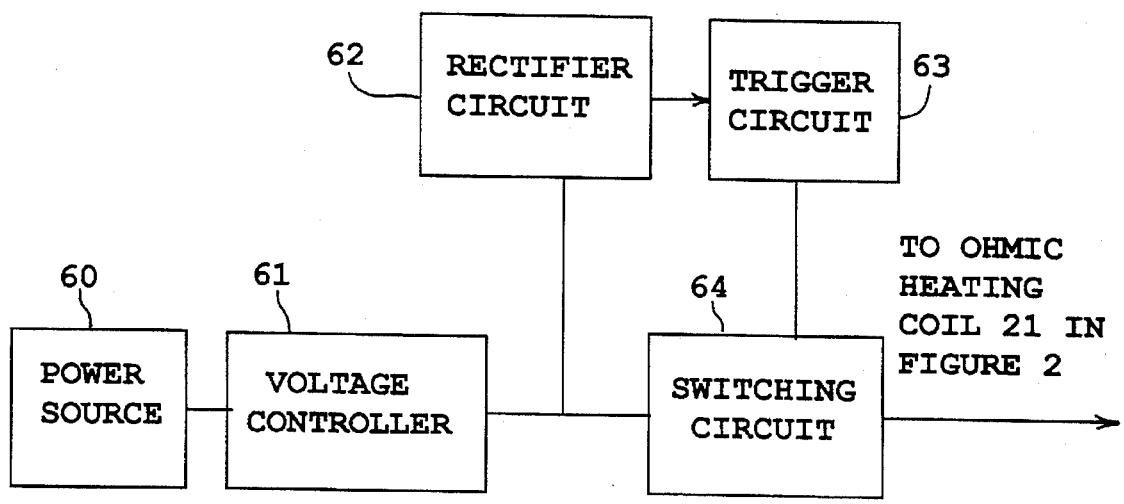
FIG. 6 is a detailed block diagram of a driving power source for the ohmic heating coils shown in FIG. 1.

A detailed block diagram of the driving power source 22 for the ohmic heating coils 21 of FIG. 2 is shown in FIG. 6. By way of example, this driving power source for the ohmic heating coils is constructed with a power source 60 of up to 2000 volts with single phase current capability of 10 kiloamperes, with a total power capability of 2 Megawatts, a voltage controller 61 which controls the output power of the power source 60, a rectifier circuit 62, which rectifies the controlled output current, a trigger circuit 63, which generates firing signals, and a switching circuit 64 to turn the system on and off.

The vertical field coils 23 of FIG. 2 are for positioning the high energy flux within the toroidal containment vessel 11 are made of copper and encircle the torus in the same fashion as the ohmic heating coils 21 but are configured so that the net vertical field current circulating around the iron core is zero. Residual mutual inductance is cancelled out by raising the mutual inductance in the power feed circuits. An active feedback system from sensors that determine the position of the toroidal high energy flux plasma quickly change the current in the vertical field coils 23 to maintain position within the toroidal chamber.

Figure 7:
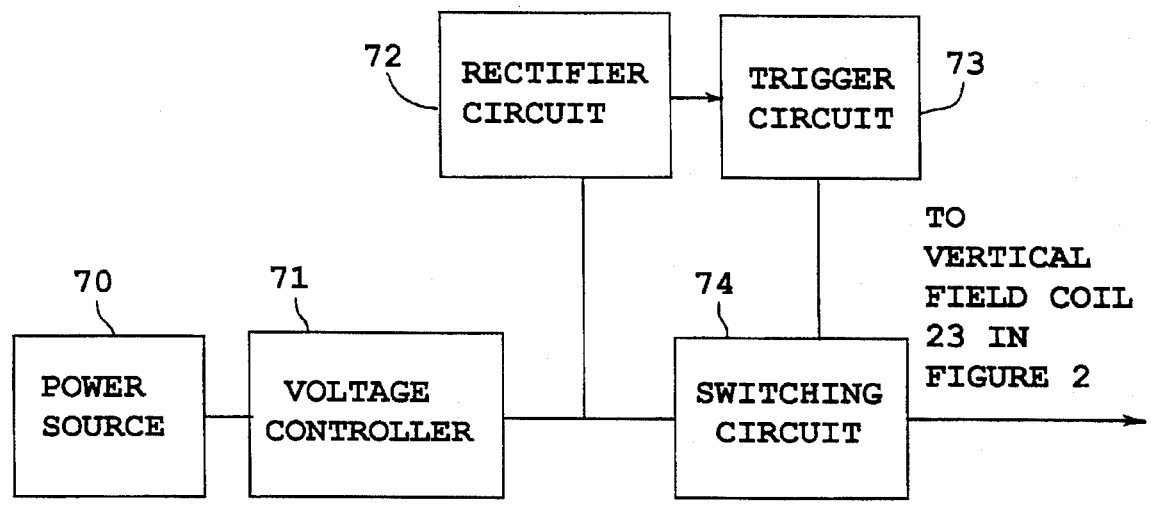
FIG. 7 is a detailed block diagram of a driving power source for the vertical field coils shown in FIG. 1.

A detailed block diagram of the driving power source 24 for the vertical field coils is shown in FIG. 7. By way of example, this driving power source for the vertical field coils is constructed with a power source 70 of up to 180 volts with single phase current capability of 10 kiloamperes, with a total power capability of 2 Megawatts, a voltage controller 71 which controls the output power of the power source 70, a rectifier circuit 72, which rectifies the controlled output current, a trigger circuit 73, which generates firing signals, and a switching circuit 74 to turn the system on and off.

The iron core bias field coils 25 of FIG. 2 consist of 40 turns of copper conductor 2×5 cm in cross section. these are wrapped around the center of the iron core.

Figure 8:
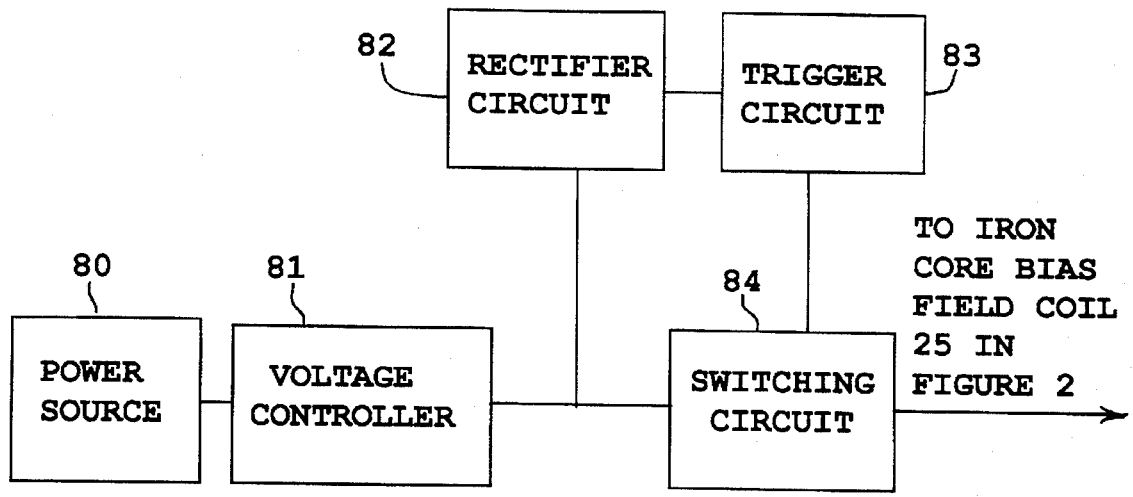
FIG. 8 is a detailed block diagram of a driving power source for the iron core bias field coils shown in FIG. 1.

A detailed block diagram of the driving power source 26 for the iron core bias field coils is shown in FIG. 8. By way of example, this driving power source for the iron core bias field coils is constructed with a power source 80 of up to 180 volts with single phase current capability of 10 kiloamperes, with a total power capability of 2 Megawatts, a voltage controller 81 which controls the output power of the power source 80, a rectifier circuit 82, which rectifies the controlled output current, a trigger circuit 83, which generates firing signals, and a switching circuit 84 to turn the system on and off.

The injector portion 30 of FIG. 3 is for injecting pellets of feedstock material into the process plasma formed with the equipment described above. The injector technology assumed for this example is a a gas fired pellet gun. For detailed discussion of pellet injection equipment options see "Pellet Injection Technology", Combs, Rev. Sci. Instrum., Vol 64, No. 7, July, 1993. The injector is designed to shoot pellets of feedstock material at velocities of up to 3 km/sec.

Driving power sources 42,43 and 44 of FIG. 4 are used either singly or together to rapidly applying large amounts of power, on a time scale of from about 50 millionths to about 400 millionths of a second to for heating and stabilization as the pellet and the process plasma combine to form a combination plasma.

Figure 9:
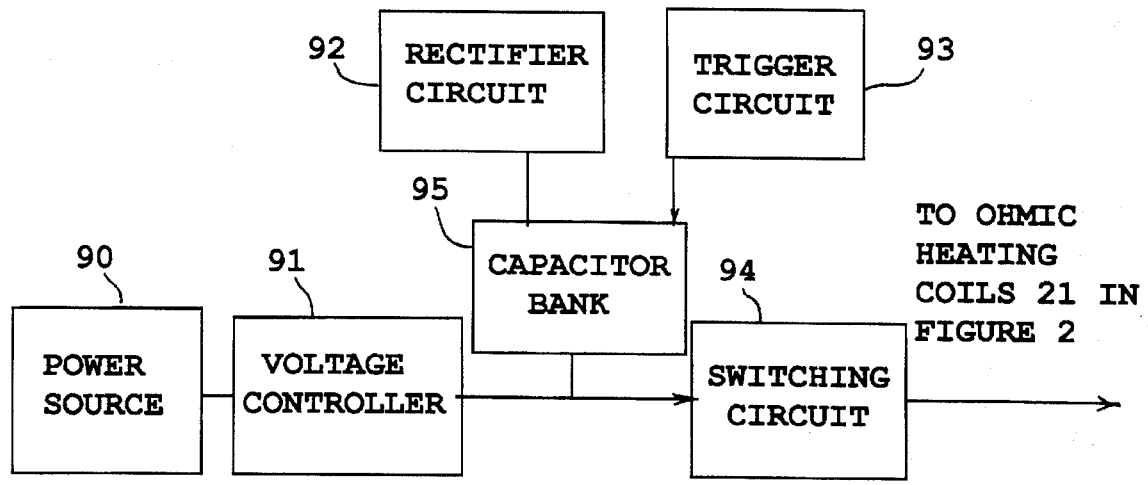
FIG. 9 is a detailed block diagram of an enhanced driving power source for the ohmic heating coils.

A block diagram of the enhanced driving power source 43 for the ohmic heating coils 21 in FIG. 2 is shown in FIG. 9. By way of example, this enhanced driving power source includes a high voltage capacitor bank 95 designed to be able to deliver voltages of 100 kilovolts and currents of up to 50 kiloamperes for a period of about 400 microseconds. This enhanced driving power source 43 is constructed with a power source 90 of up to 2000 volts with single phase current capability of 10 kiloamperes, with a total power capability of 2 Megawatts, a voltage controller 91 which controls the output power of the power source 90, a rectifier circuit 92, which rectifies the controlled output current, a trigger circuit 93, which generates firing signals, and a switching circuit 94 to turn the system on and off.

Figure 10:
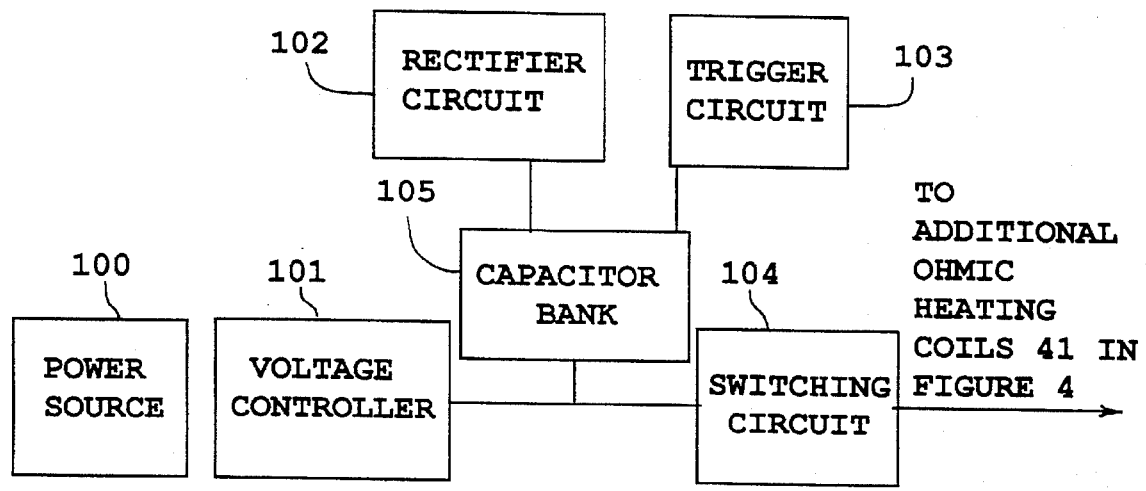
FIG. 10 is a detailed block diagram of the driving power source for the additional ohmic heating coils.

The block diagram of the driving power source 42 for the additional ohmic heating coils 41 in FIG. 4 is shown in FIG. 10. This driving power source 42 includes a high voltage capacitor bank 105 designed to be able to deliver voltages of 100 kilovolts and currents of up to 50 kiloamperes for a period of about 400 microseconds. This driving power source 43 for the ohmic heating coils 16 is constructed with a power source 100 of up to 2000 volts with single phase current capability of 10 kiloamperes, with a total power capability of 2 Megawatts, a voltage controller 101 which controls the output power of the power source 100, a rectifier circuit 102, which rectifies the controlled output current, a trigger circuit 103, which generates firing signals, and a switching circuit 104 to turn the system on and off.

Figure 11:
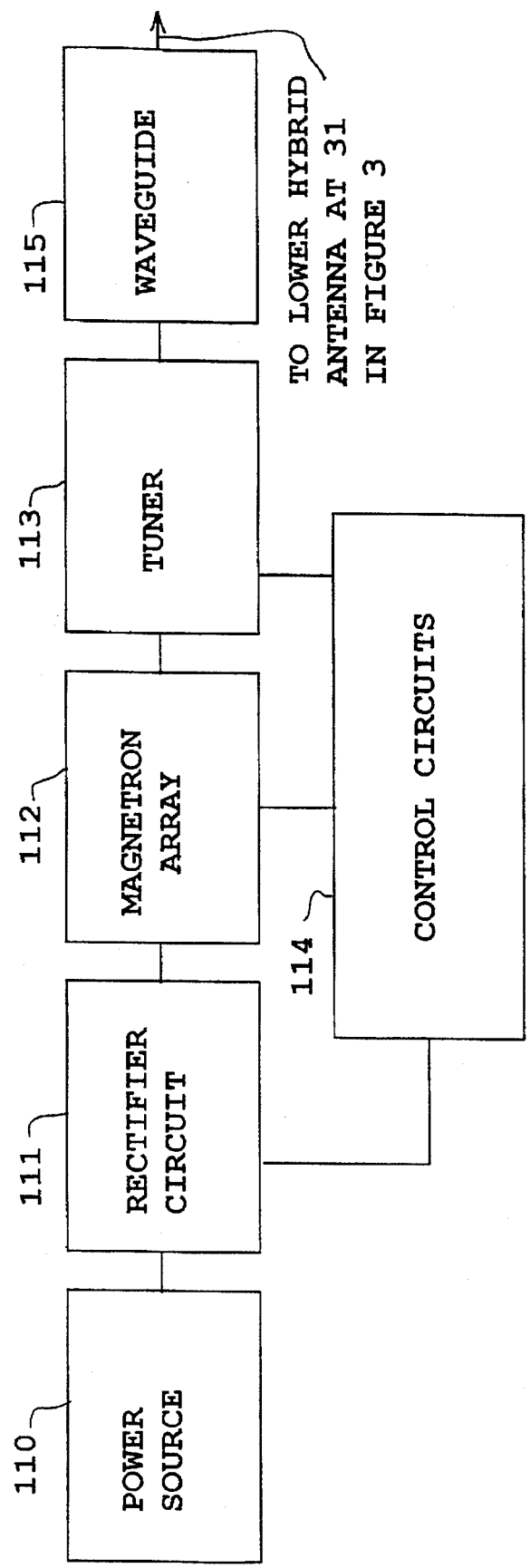
FIG. 11 is a detailed block diagram of a driving power source for the lower hybrid heating system.

A block diagram of the driving power source 44 for the lower hybrid frequency generator in FIG. 4 is shown in FIG. 11. By way of example, the driving power source for the lower hybrid heating system is constructed with a power source 110, of up to 25,000 volts, with a single phase current capability of 1000 amperes, with a total power capacity of 25 megawatts, a rectifier circuit 111 which rectifies the power output, a magnetron array 112 which produces r.f. power between 3 and 10 GHz, a tuner 113 which is automatically driven by control circuits 114 to keep power absorption in the toroidal plasma well matched, as it evolves from a high energy flux plasma to a large volume process plasma. The r.f. is transmitted to the lower hybrid antenna, 31, in FIG. 3 via waveguide, 115.

Means of diverting the process plasma out of the containment vessel 11 of FIG. 1 into a second containment vessel is shown as a top view and a cross section in FIG. 12.

FIG. 12 is a top view and a cross section, partly in blocks, showing construction details of the toroidal containment vessel 11 of FIG. 1 modified by the addition of magnetic field diverting coils 120, a driving power source 121 for the diverting coils, toroidal field nulling coils 122, a driving power source 123 for the toroidal field nulling coils, a second containment vessel 124, expander magnetic field coils 125, a driving power source 126 for the expander field coils, additional deposition stages 127, and additional exhaust pipes 128.

The expander magnetic field coils 125 of FIG. 12 are fitted around the additional containment vessel 124 and are made of copper. The expander magnetic field coil produces a magnetic field approximately parallel to the long axis of the additional containment vessel 124 and moves the plasma along the chamber. This second vacuum vessel 124 can be from 2 to more than 100 meters in length, with a diameter from 1 to more than 10 meters, providing an extremely large surface area for the location of the plasma deposition stages.

FIG. 13 is a schematic depicting the magnetic fields as a surface to show how the magnetic field surface 130, along with the plasma are dimpled out to provide the path to divert the high energy flux plasma or the large volume process plasma into the second vacuum vessel. The diverting field coils 120 are shaped as shown in in FIG. 13, and can be made of copper. The electric current in the divertor coils goes in the direction shown by the arrows 132. For the technology of divertor field coils, see "Physics of Plasma-Wall Interactions in Controlled Fusion", Post et al, NATO ASI Series, Series B: Physics Vol. 131, Plenum Press, NY, 1984. Other types of divertors are also possible for use in conjunction with this invention.

The driving power sources can be run either steady state or pulsed. For example, in a pulsed mode of operation, the high energy flux plasma could be removed from the torus and transferred into the additional containment vessel, with injection of pellets in that area. Alternatively, the resultant colder large volume process plasma that is formed from the pellet can be diverted into the second plasma chamber for additional processing, such as adding additional gases to the plasma.

Figure 14:
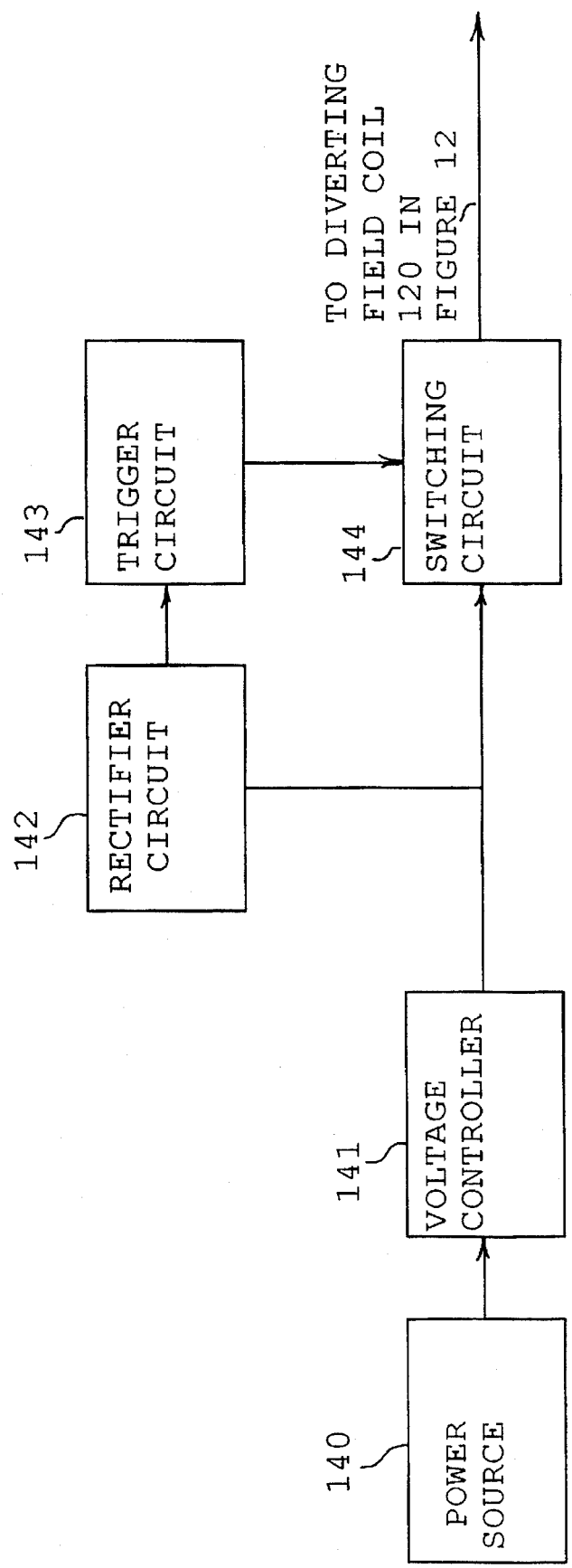
FIG. 14 is a detailed block diagram of a driving power source for the diverting field coil shown in FIG. 12.

A detailed block diagram of the driving power source 121 for the diverting magnetic field coils 120 in FIG. 12 is shown in FIG. 14. By way of example, this driving power source for the diverting field coils is constructed with a power source 140 of up to 180 volts with single phase current capability of 10 kiloamperes, with a total power capability of 2 Megawatts, a voltage controller 141 which controls the output power of the power source 140, a rectifier circuit 142, which rectifies the controlled output current, a trigger circuit 143, which generates firing signals, and a switching circuit 144 to turn the system on and off.

Figure 15:
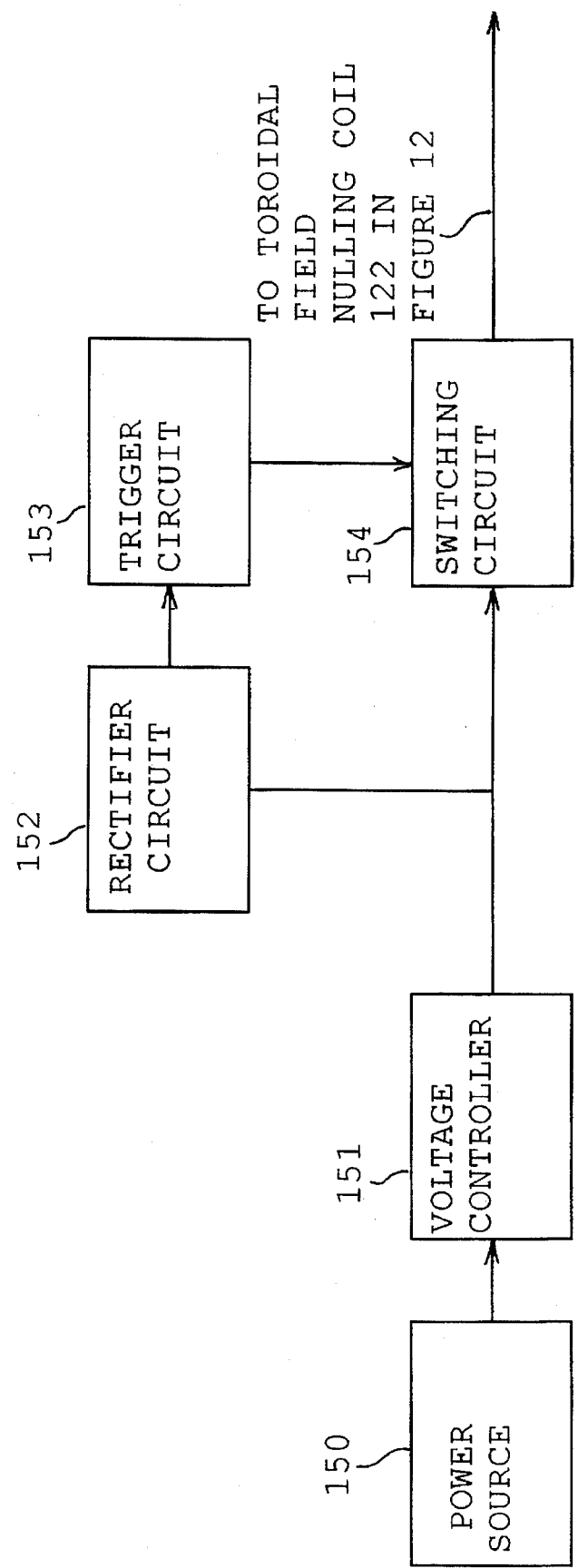
FIG. 15 is a detailed block diagram of a driving power source for the toroidal field nulling coils shown in FIG. 12.

A detailed block diagram of the driving power source 123 for the toroidal field hulling coils in FIG. 12 is shown in FIG. 15. By way of example, this driving power source for the toroidal field hulling coils is constructed with a power source 150 of up to 180 volts with single phase current capability of 10 kiloamperes, with a total power capability of 2 Megawatts, a voltage controller 151 which controls the output power of the power source 150, a rectifier circuit 152, which rectifies the controlled output current, a trigger circuit 153, which generates firing signals, and a switching circuit 154 to turn the system on and off.

Figure 16:
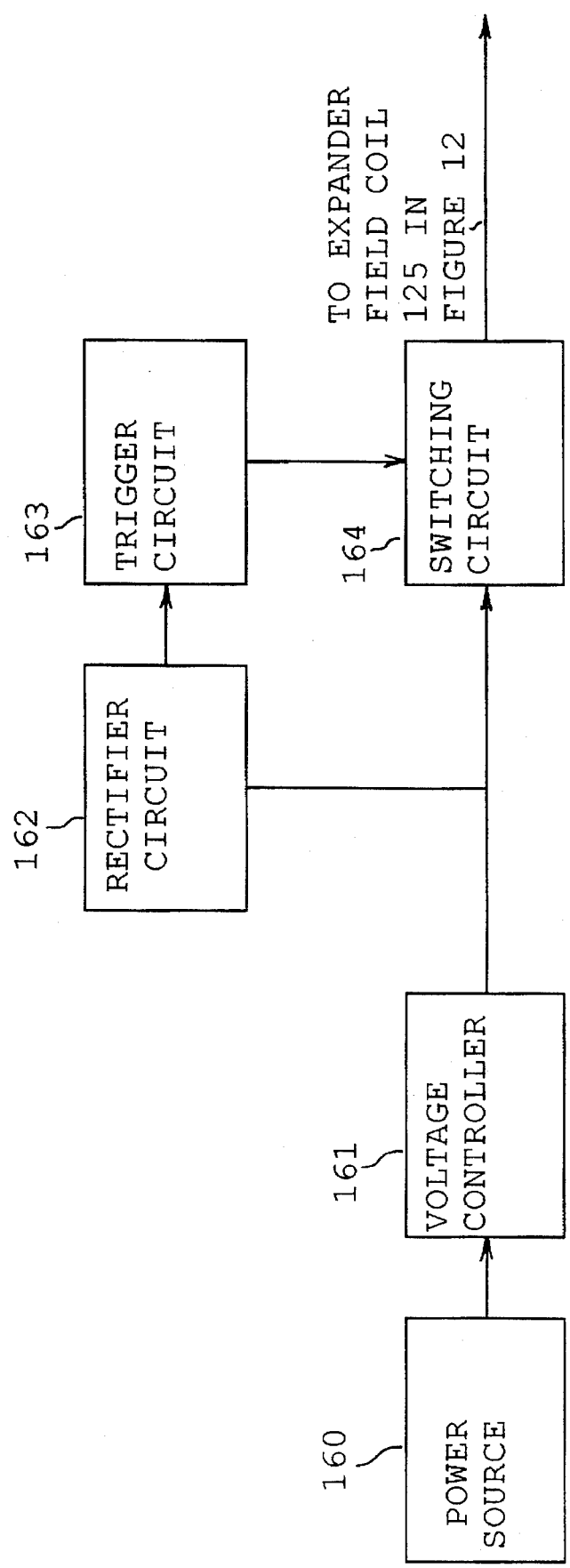
FIG. 16 is a detailed block diagram of a driving power source for the expander field coils shwon in FIG. 12.

A detailed block diagram of the driving power source 125 for the expander field coils in FIG. 12 is shown in FIG. 16. By way of example, this driving power source for the diverting field coils is constructed with a power source 160 of up to 400 volts with single phase current capability of 10 kiloamperes, with a total power capability of 4 Megawatts, a voltage controller 161 which controls the output power of the power source 161, a rectifier circuit 162, which rectifies the controlled output current, a trigger circuit 163, which generates firing signals, and a switching circuit 164 to turn the system on and off.

Operation of the above equipment to provide a novel method of coating deposition stages with ionized and non-ionized species of elements of any feedstock material is explained below.

FIG. 17, describes the geometry of the magnetic fields that will confine the plasma spaced from the walls of the toroidal containment vessel 11 of FIG. 1. Initially, the toroidal magnetic field generation coils 13 of FIG. 1 are first energized with electric current supplied by the driving power source 14 for the toroidal magnetic field coils to produce a toroidal magnetic field 170 designated by $B_t$, as shown in FIG. 17.

Next, the gas in the toroidal containment vessel 11 of FIG. 1 is removed through the exhaust pipe 28 of FIG. 2 to create a vacuum of about $10^{-7}$ torr. Next, a valve in the gas inlet 12 is opened to supply a generation gas, such as hydrogen, helium or neon at a pressure of about $10^{-4}$ torr.

The ohmic heating coils 21 of FIG. 2 are then energized with electric current from the driving power source 22 for the ohmic heating coils. The time dependence 180 of the applied voltage is shown in FIG. 18a. The ignitor 20 of FIG. 2, which can be an electron beam, is activated at the onset of the ohmic heating coil 21 energization to cause electrical breakdown in the gas and produce an initially low temperature plasma in the toroidal containment vessel 11. This initially low temperature toroidal plasma fills the entire toroidal containment vessel 11, and has an electrical resistance, R. A toroidal electric current 171 designated $J_t$, in FIG. 17, ohmically heats the plasma. The net ohmic heating power is then given by:

$$P = R \, J_t^2 \quad (1)$$

similar to ohmic heating in a copper wire. The iron yoke 15 of FIG. 1 inductively couples the electric current in the ohmic heating coils 21 of FIG. 1 with the toroidal current $J_t$. The current in the toroidal direction has an additional function to confine the plasma and keep it spaced from the walls by producing a poloidal magnetic field component, 172 designated $B_p$, which wraps around the plasma as shown in FIG. 17.

The vertical field coils 23 of FIG. 2 are activated with electrical current from the driving power source 24 for the vertical field coils of FIG. 2 shortly after the initial low temperature plasma is formed to aid in keeping the plasma spaced from the walls. The iron core bias field coils 25 of FIG. 2 are used to initially bias the magnetic field in the yoke to increase the time of the flat period in FIG. 18a. Limiters 27 of FIG. 2 are metallic or ceramic water cooled devices that shape the plasma by helping to define the dimension of the space between the plasma and the wall of the toroidal containment vessel 11.

As time increases, this initial toroidal plasma heats and the plasma fills the toroidal volume inside the boundary defined by the limiters and reaches the physical conditions of temperature, energy flux and total energy needed for specific feedstock processing needs. The toroidal current time dependence 181 is shown in FIG. 18b, the electron number density time dependence 182 is shown in 18c and the electron temperature time dependence 183 is shown in 18d. Generation gas is periodically added to the chamber during the plasma formation process via the gas inlet 12 of FIG. 1. The plasma is finally extinguished at the the end of the time period 180 as shown in FIG. 18a when the voltage applied by the driving power source 22 for ohmic heating coils. of FIG. 2 is switched off. This typical time period for this example equipment is from 400 to 600 milliseconds.

The volume of the large volume process plasma is given by the expression below:

$$V = 2\pi R_M r_m^2$$

where:

$R_M$ = The major radius of the toroidal volume inside the limiters.
(see 173 in FIG. 17.)
= 100 cm for this example $r_m$ = The maximum minor radius of the toroidal volume inside the limiters.
(see 174 in FIG. 17.)
= 50 cm for this example The energy flux is carded mostly by the electrons and is given by the expression:

$$\text{Energy Flux} = nkT \, vk/4$$

where:

n=electron number density
v=average electron velocity
k=Boltzmann's constant
T=Electron Temperature The total energy in the volume V, is:

$$\text{TOTAL ENERGY} = nkTV$$

The physical properties of the typical process plasma are:

Composition: hydrogen atoms, hydrogen ions, electrons
Volume: $10^7$ cm$^3$
Electron Number Density: $3 \times 10^{13}$ cm$^{-3}$
Total Electrons: $3 \times 10^{20}$
Electron Temperature: 500,000 to 10,000,000 degrees Celsius
Energy Flux: 20 KW to 1.6 MW/cm$^2$
Total Energy: 3,000 to 50,000 joules Pellets of low atomic number materials, such as deuterium, boron, carbon and aluminum have been injected into controlled fusion research plasmas with parameters similar to those described above. See for example, "An Assessment of the Feasibility of Fueling a Tokamak Reactor With Lithium-Tritide Pellets", S. C. McCool et al, University of Texas fusion Research Center Report FRCR #389, May 26, 1991. The controlled fusion research applications of pellet injection include refueling with deutrium or tritium, and limiting the sputtering of high atomic number materials such as iron, tungsten, titanium and molybdem from the toroidal containment vessel materials. Boron, carbon and aluminum pellets have been injected as pellets, ionized by the plasma and deposited to control sputtering and to act as gettering materials on the walls.

FIG. 19 shows the major impact the ablation, vaporization, dissociation and ionization process has on the plasma parameters. Pellets are injected at a time designated by 190 as shown in FIG. 19a. The increase in voltage caused by the pellet injection 191 is shown in FIG. 19a, the temperature drop 193 is shown in FIG. 19d, and the number density increase 192 is shown in FIG. 19c, the perturbations 191, 192, and 193 last about 10 milliseconds. These fusion research pellets are sized such that the plasma can recover and go back to its original parameters, as shown in FIG. 19 without further stabilization efforts.

Pellets with atomic numbers of about 16 can extinguish the plasma. See for example, "Wall Conditioning Experiments on TFTR Using Impurity Pellet Injection", Strachan et al, Journal of Nuclear Materials 217, 145–153, 1994. Pellets with atomic numbers greater than 16, such as tungsten, with atomic number 74 will abruptly extinguish the plasma, with the behavior shown in FIG. 20. Pellets are injected at a time designated 190. The time dependence of the voltage 200 of FIG. 20a shows the voltage first rising then rapidly going to zero. The time dependence of the current 201 is shown in FIG. 20b. The time dependence of the density 202 is shown in FIG. 20c and the time dependence of the temperature 203 is shown in FIG. 20d.

A principal object of this invention is to prevent the disruption shown in FIG. 20 so that feedstock material of any atomic number, from 2 to 103 is first transformed into a "combination plasma" which is a mixture of the ionizing pellet material and the process plasma and evolves into a "product plasma" which is a lower temperature, higher density ionized gas plasma composed principally of the ionized species of elements of the feedstock material with a space maintained between the plasma and the walls of the toroidal containment vessel 11 of FIG. 1.

Deposition stages 45 of FIG. 4 are then coated with the species in the "product plasma." Operation of this invention with any feedstock material is described below.

The feedstock material is prepared for injection into this process plasma by forming it into pellets. The total energy and total number of electrons in the example process plasma described above is sufficient to utilize pellets of 0.01 to about 2 milliliters in volume. The feedstock material can be any material, such as a metal, a non-metal such as alumina or even a liquid or a gas. They can be formed into pellets that are spherical, ellipsoidal or any arbitrary shape. In the case of liquids and gases, they can be frozen and formed into portions which are spherical, ellipsoidal or arbitrary shapes.

The pellets are injected into the "process plasma" using the injector portion 30 of FIG. 3. The depth the pellets penetrate the process plasma depends the pellet size, the atomic number, Z, the magnitude of the energy flux and the total energy available to the pellet. The depth of penetration is also sensitive to the radial location, r, as defined by 175 in FIG. 17. In one mode of operation, the process plasma is produced with a thermal electron distribution, and the pellet ablates by absorbing energy from the electrons and ions of the "process plasma" which leads to rapid cooling. The "process plasma" can be cooled by energy lost by radiation from the multiply ionized high atomic number ions. Besides this cooling effect from radiation the resistance of the plasma can rapidly increase. The resistance of the plasma is given by the expression:

$$R = f(\text{geometry}) g(Z_{\text{eff}})/T_e^{3/2}$$

where:
f(geometry)=a function of geometric parameters.
$g(Z_{\text{eff}})$=a function of the average atomic number, $Z_{\text{eff}}$, of the ions in the plasma. It increases as $Z_{\text{eff}}$ increases.
$T_e$=The average electron temperature When the feedstock is a material, such as tungsten, the atoms can become multiply ionized and increase $Z_{\text{eff}}$ which increases the resistance very rapidly, on the order of 50 to 300 microseconds. The resistance could increase by a factor of 10 to 50. This increases the power requirements to maintain toroidal current at a high enough value to maintain a space between the plasma and the containment vessel wall.

An object of this invention is to provide an apparatus for rapidly heating the plasma during the pellet injection process to replace energy lost by radiation from multiply ionized high atomic number species. Another object of this invention is to increase the voltage driving the toroidal current 170 of FIG. 17 to maintain the current and the resultant poloidal magnetic field 172 as the resistance of the plasma rises.

It is necessary to inject the pellet with a velocity such that it doesn't vaporize, dissociate and ionize too quickly, but ionizes before it passes the center of the toroidal plasma.

One reason the pellets must be shot into the plasma with a high velocity (up to 3 km/sec) is because all the energy in the volume is not immediately available because the pellet is immediately exposed to plasma electrons that move parallel to the vector sum of the toroidal magnetic field 170 and poloidal magnetic field 172 components. In most cases, a pellet of diameter, $r_p$, can receive energy quickly only from a volume in the shape of a toroidal shell with a thickness about 10 times the size of the pellet. There are even some locations in which energy is only received from a single tube of plasma with a major diameter of $R_M$ and a minor diameter about ten times the size of the pellet. Thus, to access most of the energy in the whole volume, the pellet is shot into the high energy flux plasma at a velocity from about 0.2 km/sec to 3 km/sec to intersect a sequence of such regions. The specific values being determined by the feedstock material, pellet diameter and operating conditions of the plasma processor.

The strength of the material can limit the velocity of the pellet when fired from a pellet gun because the pellet could shatter. In that case, and in the case of liquids such as sulphuric acid, or even gases, small portions, of about 0.1 to ten milliliters, are inserted with a container filling device, into capsules made discs sealed to the container with glue. The capsule could then be used as a pellet and fired from a pellet gun.

One object of this invention is to maintain the toroidal electric current 171, $J_t$, at a level sufficient to maintain the poloidal magnetic field 172 of FIG. 17 and thus keep the "combination plasma" and the "product plasma" spaced from the walls as the pellet of any feedstock material is converted into the "product plasma".

Figure 21B:
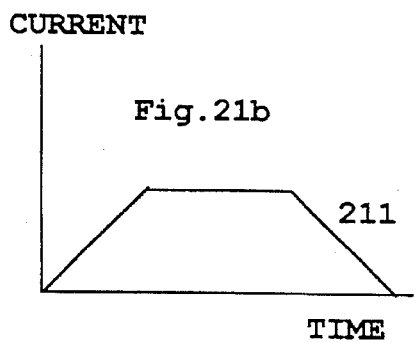
FIG. 21b is a waveform diagram showing the time dependence of electric current during high atomic number pellet injection with stabilization.
Figure 21C:
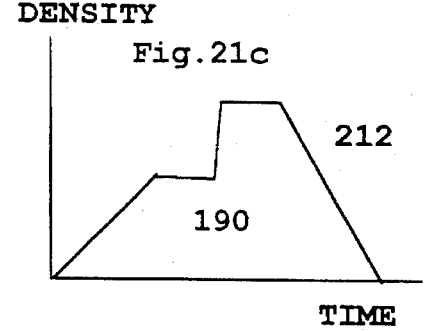
FIG. 21c is a waveform diagram showing the time dependence of electron number density during high atomic number pellet injection with stabilization.
Figure 21A:
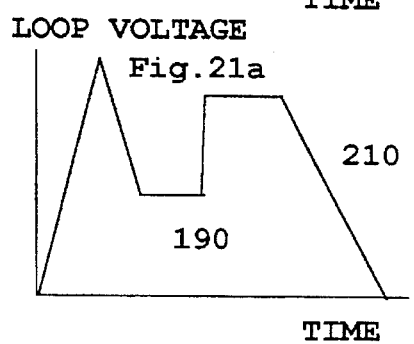
FIG. 21a is a waveform diagram showing the time dependence of loop voltage during high atomic number pellet injection with stabilization.
Figure 21D:
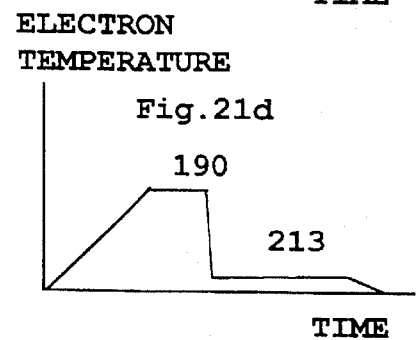
FIG. 21d is a waveform diagram showing the time dependence of electron temperature during high atomic number pellet injection with stabilization.

At least one method of maintaining the toroidal electric current is to use the enhanced driving power source 43 of FIG. 4 as shown in FIG. 9 to rapidly enhance the voltage applied to the ohmic heating coils 21 of FIG. 2 by about a factor of 2 to 100 and thus maintain the toroidal electric current 171 of FIG. 17, $J_t$ constant. Because the plasma resistance is higher, this action also increases the power being applied to the plasma to help balance the radiation losses from the high atomic number ions. The time scale for this voltage to be applied is on the order of 50 millionth of a second to 10 milliseconds. FIG. 21 shows the parameters of voltage, current, electron number density and thermal electron temperatures as this enhanced voltage is applied to a plasma that would have extinguished such as shown in FIG. 20. The pellet is injected at time 190. The voltage time dependence 210 shows the voltage raised to accomodate supplying the necessary increased power in FIG. 21a. The electric current 211 is shown constant in FIG. 21b to facilitate maintaining the space between the product plasma and the wall. The number density 212 is shown elevated in FIG. 21c. The temperature time dependence 213 is shown in FIG. 21d that indicates a lower temperature during the product plasma phase.

Another method of maintaining the toroidal electric current is to use the enhanced driving power source 42 of FIG. 4 is shown in FIG. 10 to rapidly increase the voltage applied to the additional ohmic heating coils 41 of FIG. 4 by about a factor of 2 to 100 and thus maintain the toroidal electric current 171 of FIG. 17, $J_t$ constant. These additional ohmic heating coils can also be located inside the toroidal confinement vessel 11 of FIG. 1 to improve the speed with which the voltage can be applied to the plasma. Because the plasma resistance is higher, this action also increases the power being applied to the plasma to help balance the radiation losses from the high atomic number ions. The time scale for this voltage to be applied is on the order of 50 millionth of a second to 10 milliseconds. The parameters of voltage, current, electron number density and thermal electron temperature behave similar to those of FIG. 21.

Another method of maintaining the toroidal electric current is to apply an electromagnetic wave heater at the lower hybrid frequency in such a way that electric current is produced in the plasma, in the same toroidal direction as the ohmic heating current. Lower hybrid heating is accomplished with an r.f. power source of between 3 and 10 Ghz that is oriented to produce an electric field in the same direction as the toroidal electric current 170 of FIG. 17. For an explanation of lower hybrid heating see "One Minute Pulse Operation in the Tore Supra Tokamak", Van Houtte, Nuclear Fusion, Vol. 33, No. 1, 1993.

The anntena 31 is shown in FIGS. 3 and 4. The driving power source 44 for lower lower hybrid heating is shown in FIG. 11. The lower hybrid heating power produces the same beneficial effect as increasing the current as described above and also results in performance as shown in FIG. 21. Overcoming radiation losses can also be accomplished with other electromagnetic wave modes, such as ECRH, and ICRH heating.

Another object of this invention is to deposit the ionized and unionized species of the "product plasma" on the deposition stages 45 of FIG. 4. The ionized species in the "product plasma" are spaced from the walls of the toroidal containment vessel 11 of FIG. 1 by two mechanisms. The first is by the pressure applied by the toroidal magnetic field 170 and poloidal magnetic field 171 shown in FIG. 17. The second is with the limiters 27 of FIG. 2, which sharpen the edge geometry.

One method of enhancing the deposition rate is to decrease the voltage applied to the driving power source 14 for the toroidal magnetic field generation coils 13 of FIG. 1 and thus decreasing the magnitude of the toroidal magnetic field 170 of FIG. 17. This in turn will increase the rate of diffusion of ionized species across the space.

Another method of enhancing the deposition rate is to rapidly move the limiters 27 of FIG. 2 so that they are closer to the surface of the deposition stages. This will decrease the fraction of the plasma intercepted by the limitor and thus enhance the deposition rate. A pellet of about 1 milliliter in volume will deposit about 1 monolayer on deposition stages, assuming the deposition stages cover most of the wall of the toroidal containment vessel 11 of FIG. 1.

Thus, the ionized and unionized species of the "product plasma" are caused to deposit on the plasma deposition stages 45 of FIG. 4. For example, if a pellet of Silicon is injected into a hydrogen "process plasma", then $Si^+$, $SiH^+$, $SiH^2$, $SiH_3^+$, as well as radicals $Si^*$ and $SiH_3^*$ are produced and are deposited on the plasma deposition stages 45 of FIG. 4. This is an advantage for substrate preparation because the highly toxic gas $SiH_4$ does not have to be used in the manufacturing process, and the mixture of the above ions and radicals can be controlled in entirely different manners than in conventional plasma processors, such as ECRH plasma processors.

The coordination and operation of these stabilization techniques is done with feedback systems that monitor the position, temperature, density and other conditions of the "process plasma" the "combination plasma" and the "product plasma" as each occurs and activates the stabilization systems described above appropriately, in coordination with the vertical field coils 23 of FIG. 2 to keep the system centered in the toroidal containment vessel 11 of FIG. 1.

The major radius 173 of FIG. 17 can be any size from about 40 cm to 250 cm, the larger and the minor radius 174 of FIG. 17 can be from about 20 cm to 150 cm. The smaller systems would be more like present plasma processor technology. The large systems would allow new approaches to nanotechnology, to tribology and to microchip production by increasing the thruput possible with a plasma processor. The larger systems would allow technicians to enter the chamber for removal of deposition stages or other handling chores.

Another object of this invention is to cause the pellets to dissemble and be converted entirely into a gas without significant ablation. This is accomplished by operating the large volume plasma processor generation portion 10 of FIG. 1 to produce a non-thermal electron component that includes relativistic electrons with energies from 500 ev to 35 million electron volts. Relativistic electrons can penetrate material pellets of various radii. For example, see "Tables of Energy-Losses and Ranges of Electrons and Positrons", Berger and Seltzer. Nuclear Science Series 39, Washington, D.C. 1964.

It would be particularly advantageous to minimize radiation losses, because, for some feedstock materials, especially those with high Z, such as tungsten, the pellet interaction process could consume a large amount of energy and require device sizes that would be too large for practicality. In those circumstances, the method of operation of the large volume plasma processor 10 of FIG. 1 is changed to produce a non-thermal electron temperature component.

The high energy flux plasma is then composed of a thermal electron component and a nonthermal electron component. For a paper that describes such generation of nonthermal electrons see "Plasma Performance in TEXTOR after Pellet Injection", Finken et al, Fusion Technology and Plasmas, North-Holland, N.Y., I-131–I-133, 1993.

One method of producing thermal and a non-thermal electron components is to reduce the electron number density, n, to about $8 \times 10^{12}/cm^3$ and simultaneously operate with high toroidal electric field current 171, $J_t$. The nonthermal component can range from 500 ev to 35 million ev, or from 5,000,000 degrees Celsius to 350 billion degrees Celsius. These non-thermal electrons can penetrate directly to the center of the feedstock pellet, without being deflected by a cold layer of vaporized material, and can vaporize a pellet on a time scale of about 50 millionths of a second, thus minimizing the radiation loss time and make it easier to ionize pellets. See for example, "Tables of Energy Losses and Ranges of Electrons and Protons", Berger & Seltzer, Nuclear Science Series 39, Washington, D.C. The energy of the energetic electrons is a function of how long the high energy flux plasma is maintained in these conditions.

Another object of this invention is to provide additional surface area for deposition stages by adding additional magnetic field coils that can modify the magnetic field configuration so as to divert either the initial high energy flux plasma or the large volume process plasma into a second vacuum chamber to provide additional surface area for location of deposition stages. FIG. 12 is a top view and a cross section, partly in blocks, showing construction details of the toroidal containment vessel 11 of FIG. 1 with the addition of the necessary equipment to divert the plasma out of the toroidal containment vessel 11 into the additional containment vessel 124 of FIG. 12. The magnetic fields generate a magnetic channel as shown in FIG. 13, which provides a pathway for the charged particles to follow that takes them into the additional containment vessel 124. This additional containment vessel can be from one meter to tens of meters long. The plasma is guided along the chamber by the magnetic field generated by the expander field coils 125. The power supplies to drive the magnetic field coils are described in FIGS. 14, 15 and 16.

Another object of this invention is to repetitively perform pellet injections and repeat the processes described above. FIG. 21 illustrates the physical parameters of a single pellet injection and coating event of about 400 milliseconds duration. For commercial operations it is desirable to repetitively inject pellets to achieve commercial thruput of material.

Figure 22:
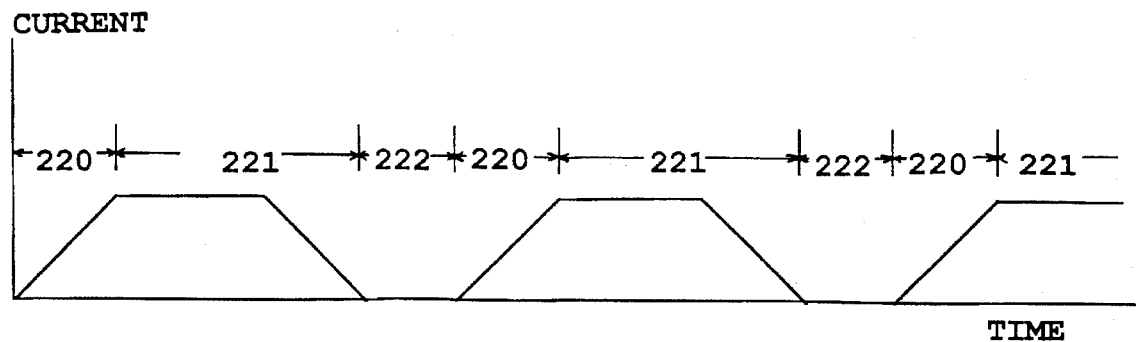
FIG. 22 is a waveform diagram for repetitively pulsed operation.

FIG. 22 is a graph of the toroidal electric current in a repetitively pulsed system. The time for the high energy flux plasma to be formed and heat to a proper temperature is designated as 220 or $t_h$. The time to vaporize, dissociate, ionize, and collect species on the deposition stages 45 of FIG. 4, is designated 221, or $t_v$. The time to reset the system for producing another sequence is designated 222, or $t_r$. In the case of Tokamak research devices, the coatings applied are partially removed each time the high energy flux plasma is produced because of sputtering from the energetic ions in the high energy flux plasma.

For a high Z feedstock and coating, sputtering of high Z materials during the ohmic heating stage 220, could make it difficult to re-heat because of energy loss from radiation. Such sputtering of material deposited on the deposition stages can be diminished by at least one means such as moving the limiters 27 of FIG. 2. The height of the limiter above the deposition stage determines the fraction of high energy plasma particles that are intercepted by the limiter compared to those striking the deposition stages. If the limiter is close to the deposition stages, say about 2 cm, during the deposition stage 221, $t_v$, the limiter will intercept a minimal amount of the flux. During the reset time 222, $t_r$, the limiter is moved to a position of 10 to 20 cm above the surface of the deposition stages, in which case most of the energetic plasma particles strike the limiter instead of the deposition stage. Alternatively, by changing the electric current in the divertor 120 of FIG. 12, the divertor can divert a minimal fraction of the high energy particles if it diverts from a position within about 2 cm of the surface of the deposition stages during the deposition stage, $t_v$, and diverts from a position 10 to 20 cm above the surface during the the reset time 222, $t_r$.

Still another technique is to make the deposition stages in a manner such that their surface can be rotated 180 degrees prior to the reset time, $t_r$, and display a low Z surface during the heating period 220, or $t_h$.

The containment vessel materials can be made of glass or quartz as well as stainless steel. The toroidal magnetic field generation coils 13 of FIG. 1 can be made with superconductors, which would save most of the energy required for operation of the invention.

This invention has been made in order to solve the problem of feedstock flexibility in plasma processing. For example, many microchips are structured with alternating layers of different elements and compounds, which are deposited in a series of steps in which the wafers are transferred between different types of applicators including chemical, plasma, or sputtering systems. This invention can provide alternate layers by injecting a sequence of pellets, each made of a different material, each of which coats the substrate with about one monolayer of the different elements.

This invention also saves time in microchip production. The time between deposition of different alternate monolayers of different materials sould be on the order of only 400 milliseconds.

This invention also improves the safety of microchip production. Toxic gases would not be needed as feedstock for plasma deposition because solid pellets of the basic elements such as silicon could be used.

In essence, this invention removes limits on conversion of any material to elemental form for commercial purposes. The large volume process plasma that results can subsequently be manipulated by injection of gases, by differential heating with plasma waves such as the previously discussed lower hybrid heating, to change the application conditions and compositions.

This invention has many possible ramifications and possible future developments. The ability to handle any feedstock opens up coating and microchip fabrication possibilities that do not presently exist. For example, the burgeoning field of nanometer technology utilizes atomized materials to produce small grain sizes of copper or other metals than can be produced via conventional technologies. See, "Atom Smith", Pool, Discover, December, 1995. The present invention would allow tungsten, or any other material to be used in nanotechnology applications on large surface areas.

By lowering the temperature of the "product plasma" to a lower temperature range, such as about 5,000° to 50,000° C. range, compounds can form and agglomeration can be promoted, leading to many unique new coatings. The second containment vessel 124 of FIG. 12 can be used to expand the "product plasma" and cool it into these lower temperature ranges.

Another application is to improve hard coatings in tribology, See "History and Current Status of Vacuum Technology", Bunstrah, J. Vac. Sci. Technology A 12(4) Jul/Aug 1994. The large volumes possible in this device would permit direct application to car body parts.

Destruction of toxic wastes can be accomplished with this device. The capsule technique described above gives a method of injecting the wastes into the high energy flux plasma. In this case, the plasma deposition stages would be designed to collect the elements that had constituted the waste. Advantages of this method would be that the system could be designed with no parasitic emissions, which are common even in plasma torch commercial technologies.

Other magnetic fusion research devices might also be used for converting any feedstock into a product plasma. Candidate devices are theta pinches, stellarators, reversed field pinches, etc. For these and other examples see, "Fusion Research", Dolan, Pergamon Press, New York, N.Y., 1982. High atomic number pellet injection in these devices would also lead to high radiation losses and loss of confinement with the plasma striking the walls.

Methods similar to those described in this invention could be used to replace energy lost by radiation, and to maintain a space between the plasma and the walls by stabilizing the plasmas.

Thus, it can be seen that the ramifications are numerous, far-reaching and exceedingly varied in usefulness.

What is claimed is:

1. A method of coating deposition stages with the ionized species of elements of any feedstock material comprising:
   a. filling a containment vessel with a low density gas chosen from a group of low atomic number gases that include hydrogen, helium and neon;
   b. ionizing the low density gas generating a low temperature process plasma;
   c. heating said low temperature process plasma to a temperature of at least 5000,000° C. generating a high temperature process plasma;
   d. confining most of the high temperature process plasma spaced from walls of the containment vessel by a magnetic field;
   e. injecting pellets of a feedstock material into the high temperature, process plasma forming a combination plasma comprising the high temperature process plasma and a plasma of the feedstock material;
   f. rapidly increasing power supplied to said combination plasma to balance radiation losses transforming all of the feedstock material into a product plasma comprising principally lower temperature, higher, density ionized and unionized species of the feedstock material;
   g. confining most of said product plasma spaced from the walls of said containment vessel by magnetic fields generated by applying higher voltage to maintain electric currents in a magnetic coil;
   h. moving a portion of said product plasma across a space between said product plasma and the walls of the containment vessel to deposit on deposition stages lining the walls of the containment vessel by adjusting magnitude of said magnetic fields;
   i. removing said deposition stages from said containment vessel.

2. The method of claim 1 where said high temperature process plasma has an electron number density of at least $5 \times 10^{12}/cm^3$, a thermal electron temperature of at least 500,000° C. and a minimum energy flux of at least 20,000 watts/$cm^2$.

3. The method of claim 2 where said minimum energy flux is at least 20 million watts/$cm^2$ to ensure the feedstock material is completely transformed into the product plasma.

4. The method of claim 1 where said high temperature process plasma has a total energy that exceeds an energy required to transform said feedstock material into said product plasma.

5. The method of claim 1 where said high temperature process plasma has a thermal electron temperature component with a temperature of at least 500,000° C. and a non-thermal electron temperature component with a temperature of at least 5,000,000° C.

6. The method of claim 5 where said non-thermal electron temperature component has a non-thermal electron energy sufficient to penetrate all of said feedstock material.

7. The method of claim 6 where said non-thermal electron temperature component has an energy flux sufficient to vaporize said feedstock material completely.

8. The method of claim 6 where said thermal electron temperature component has a thermal electron number density and said non-thermal electron temperature component has a non-thermal electron number density of at least 0.001 percent of the thermal electron number density.

9. The method of claim 1 where said product plasma is diverted into at least a second containment vessel, which is also lined with deposition stages.

10. The method of claim 1 is performed repetitively.

11. The method of claim 1 where said feedstock material is at least one metal and is formed into pellets that have spherical, ellipsoidal or arbitrary shapes that are at least 0.1 milliliters in volume.

12. The method of claim 1 where said feedstock material is at least one non-metal and is formed into pellets that have spherical, ellipsoidal or arbitrary shapes that are at least 0.1 milliliters in volume.

13. The method of claim 1 where said feed stock material is a liquid or a gas and is frozen and is formed into pellets that have spherical, ellipsoidal or arbitrary shapes that are at least 0.1 milliliters in volume.

14. An apparatus which is a large volume plasma processor for coating deposition stages with ionized and unionized species of elements of any feedstock material comprising:
   a. a toroidal containment vessel with walls;
   b. a gas inlet to supply a generating gas into said toroidal containment vessel;
   c. means to ionize the generating gas;
   d. means for generating a toroidal magnetic field substantially parallel to the walls of said toroidal containment vessel and substantially filling said toroidal containment vessel;
   e. means for generating a toroidal current which is substantially parallel to said toroidal magnetic field and generates a poloidal magnetic field perpendicular to said toroidal magnetic field;
   f. means for igniting the generating gas to produce a low temperature process plasma;
   g. means for heating the low temperature process plasma to produce a high temperature process plasma which has a low density and a temperature of at least 500,000° C.;
   h. means for controlling a space between said high temperature process plasma and the walls of the containment vessel;
   i. means for injecting pellets of a feedstock material at high velocity into said high temperature process plasma;
   j. means for rapidly increasing a heating power of the means for heating to balance radiation losses during a transformation of said high temperature process plasma into a product plasma comprising principally lower temperature, higher density ionized and unionized species of the feedstock material;
   k. means for rapidly stabilizing said product plasma to maintain a space between the product plasma and the walls of the containment vessel;
   l. means for moving said product plasma across a space between the product plasma and the walls of the containment vessel to deposit the ionized and unionized species of the feedstock material on deposition stages lining the walls of the containment vessel;

m. means for removing the deposition stages.

15. The apparatus of claim 14 further comprising a means for diverting said product plasma out of said containment vessel into at least a second containment vessel which is also lined with deposition stages.

16. The apparatus of claim 15 said second containment vessel is an elongated evacuated container and is surrounded by magnetic field generating coils which produce magnetic fields that are parallel to a long axis of said elongated evacuated container and substantially guide and confine the product plasma substantially spaced from walls of said elongated evacuated container.

17. The apparatus of claim 15 further comprising a enhanced diffusion means for moving said product plasma across the space between the product plasma and walls of said elongated evacuated container.

18. The apparatus of claim 14 further comprising a means of repetitively cycling.

19. The apparatus of claim 14 where the high temperature process plasma has a temperature of at least 11,000° C. and a number density of at least $5 \times 10^{13}/cm^3$.

20. The method of claim 1 where the containment vessel has a major radius which is between 40 cm and 250 cm and a minor radius which is between 20 cm to 200 cm.

* * * * *